US008514376B2

(12) United States Patent
D'Aligny et al.

(10) Patent No.: US 8,514,376 B2
(45) Date of Patent: Aug. 20, 2013

(54) DISTANCE MEASURING

(75) Inventors: Auguste D'Aligny, Paris (FR); Richard Day, Fontenay-sour-Bois (FR); Yuri P. Gusev, Alvsjo (SE)

(73) Assignee: Trimble 3D Scanning, Fontenay-sous-Bois (FR)

( * ) Notice: Subject to any disclaimer, the term of this patent is extended or adjusted under 35 U.S.C. 154(b) by 0 days.

(21) Appl. No.: 13/416,814

(22) Filed: Mar. 9, 2012

(65) Prior Publication Data

US 2012/0170018 A1    Jul. 5, 2012

Related U.S. Application Data

(60) Division of application No. 12/731,048, filed on Mar. 24, 2010, now Pat. No. 8,149,391, which is a continuation of application No. PCT/EP2007/008487, filed on Sep. 28, 2007.

(51) Int. Cl.
*G01C 3/08* (2006.01)

(52) U.S. Cl.
USPC ........................... 356/4.07; 356/4.01; 356/4.1

(58) Field of Classification Search
USPC ............. 356/3.01–3.15, 4.01–4.1, 5.01–5.15, 356/6–22, 28, 28.5, 139.01–139.1
See application file for complete search history.

(56) References Cited

U.S. PATENT DOCUMENTS

| 4,856,899 A | 8/1989 | Iwaoka et al. |
| 5,362,970 A | 11/1994 | Pryor et al. |
| 5,955,921 A * | 9/1999 | Ide et al. ........................ 330/254 |
| 6,439,460 B1 | 8/2002 | Chang |
| 6,594,000 B2 | 7/2003 | Green et al. |
| 8,149,391 B2 | 4/2012 | D'Aligny et al. |
| 2005/0094238 A1* | 5/2005 | Kostamovaara et al. ...... 359/245 |

FOREIGN PATENT DOCUMENTS

EP    0 848 495 A2    6/1998

OTHER PUBLICATIONS

International Search Report and Written Opinion of PCT Application No. PCT/EP2007/008487, mailed on Jun. 16, 2008, 12 pages total.
Non-Final Office Action of Sep. 28, 2010 for U.S. Appl. No. 12/731,048, 8 pages.
Final Office Action of May 13, 2011 for U.S. Appl. No. 12/731,048, 8 pages.
Interview Summary of Aug. 10, 2011, for U.S. Appl. No. 12/731,048, 3 pages.
Notice of Allowance of Nov. 25, 2011 for U.S. Appl. No. 12/731,048, 10 pages.

* cited by examiner

*Primary Examiner* — Luke Ratcliffe
(74) *Attorney, Agent, or Firm* — Kilpatrick Townsend & Stockton LLP

(57) ABSTRACT

A distance measuring method includes: emitting a pulse of measuring light towards an object; receiving a pulse measuring light from the object and generating a pulse signal corresponding to the pulse of measuring light received from the object; delaying a first portion of the generated pulse signal for a predetermined time; generating an intensity signal indicative of an intensity of the generated pulse signal, while delaying the first portion of the generated pulse signal; amplifying the delayed first portion of the generated pulse signal using a gain dependent on the generated intensity signal; and determining a value representing a distance based on the amplified delayed first portion of the generated pulse signal.

7 Claims, 7 Drawing Sheets

DISTANCE MEASURING

This application is a division of U.S. patent application Ser. No. 12/731,048, filed Mar. 24, 2010, which claims priority to and is a continuation of International Patent Application No. PCT/EP2007/008487, filed on Sep. 28, 2007, the disclosures of which are hereby incorporated by reference in their entirety for all purposes.

BACKGROUND OF THE INVENTION

The present invention relates to a distance measuring instrument and a distance measuring method.

In particular, the invention relates to a distance measuring instrument and method where modulated measuring light is emitted towards an object and wherein measuring light received back from the object is detected and analyzed. A value representing a distance from the object is determined based on such analysis.

A conventional distance measuring instrument comprises a laser generating pulses of measuring light, and optics to direct the pulses of measuring light towards an object. Pulses of measuring light received back from the object are supplied to a light sensor to generate electrical signals corresponding to the light pulses, and the electrical pulse signals are amplified and analyzed. The analysis includes determination of occurrence times between subsequent pulses to determine the distance from the object based on the determined occurrence times.

It has been found that the conventional distance measuring instruments and methods could be improved with respect to at least one of measurement accuracy, measurement speed and distance measuring range.

SUMMARY OF THE INVENTION

The present invention has been accomplished taking the above problems into consideration.

Embodiments of the present invention provide a distance measuring instrument and distance measuring methods having advanced performance, in particular with respect to accuracy or speed.

According to an embodiment of the invention, the distance measuring instrument comprises a variable gain amplifier for amplifying a detected signal, wherein a higher gain is applied when the detected signal has a low intensity and wherein a relatively lower gain is applied when the detected signal has a relatively higher intensity.

According to a further embodiment of the present invention, the distance measuring instrument comprises a first analyzer for analyzing the detected signal such that the gain of the variable gain amplifier can be set based on a result of this analysis.

According to a further embodiment, the distance measuring instrument comprises a signal delay module for delaying a first portion of a detected signal, wherein a first analysis of a second portion of the detected signal is performed while the first portion is delayed. According to an embodiment herein, it is then possible to derive a gain value from the analyzed second portion of the detected signal, and to supply the derived gain value to the variable gain amplifier such that the gain of the variable gain amplifier is set when the delayed first portion of the detected signal arrives for amplification. The variable gain amplifier will then amplify the detected signal according to the currently supplied gain value.

In particular embodiments, the gain value is determined such that the amplified signal outputted from the variable gain amplifier has a substantially constant intensity which is relatively independent of the intensity of the detected signal. The amplified signal can then be subject to further analysis, wherein this analysis is relatively independent of the intensity of the original detected signal. This can be of a particular advantage in practice since measuring light received back from the object and the corresponding detected signals may vary by many orders of magnitude, depending on the distance of the object from the measuring instrument and on an albedo of the object.

According to an exemplary embodiment of the invention, a distance measuring instrument comprises at least one light source; at least one light detector; optics to direct measuring light emitted from the at least one light source towards an object and to direct measuring light received back from the object to the at least one detector; a signal delay module; a first signal analyzer; and a variable gain amplifier; wherein: an output of the at least one light sensor is connected to an input of the signal delay module; the output of the at least one light sensor is connected to a signal input of the first signal analyzer; an output of the signal delay module is connected to a signal input of the variable gain amplifier; and an output of the first signal analyzer is connected to a gain setting input of the variable gain amplifier.

As used in the context of this application, the term connected is not limited to mean directly connected but shall also encompass functional connections with intermediate components. For example, if an output of a first component is connected to an input of a second component this comprises a direct connection wherein an electrical conductor directly supplies an outputted signal from the first component substantially unchanged to the input of the second component, and this also comprise that the connection is via one or more additional components, such as an intermediate amplifier or filter which modifies the signal outputted from the first component before it is inputted to the second component. Still, the connection is a functional connection in that, if the signal outputted from the first component undergoes gradual or prompt changes, a corresponding and maybe modified change will be applied to the input of the second component.

According to exemplary embodiments of the invention, the signal delay module delays an inputted signal by a predetermined signal delay time before it is outputted. The signal delay time can be greater than or equal to one of a processing time associated with the first signal analyzer, a settling time associated with the variable gain amplifier, and a sum of the processing time of the first signal analyzer and the settling time of the variable gain amplifier.

The processing time associated with the first signal analyzer is defined in the context of the present invention as the time elapsed from the application of an ideal instantaneous step signal to the input of the first signal analyzer to a time at which the output of the first signal analyzer has entered and remained within a value range between 0.5 to 1.5 times the final value established at the output of the first signal analyzer.

Similarly, the settling time associated with the variable gain amplifier is defined in the context of the present invention as the time elapsed from supplying the settled output from the first signal analyzer to the variable gain amplifier and a time when the variable gain amplifier has adjusted its amplification to its final value with an accuracy within 0.5 to 1.5 times the final value of the adjusted amplification.

According to exemplary embodiments, the signal delay time is greater than one of 0.5 ns, 1.0 ns, 3 ns, 5 ns and 7 ns.

According to exemplary embodiments, the first signal analyzer is configured to provide an output signal at its output which is indicative of an intensity of an input signal supplied to its signal input. For example, the output signal can be indicative of a peak value of the input signal, wherein a maximum amplitude of the input signal may represent the peak value. However, other values, such as an integrated energy and other suitable values, can be determined by the first signal analyzer to be indicative of the intensity or other characteristics of the input signal.

According to an exemplary embodiment, the variable gain amplifier is an analog amplifier. In an exemplary embodiment herein, the variable gain amplifier comprises a divider circuit.

According to other exemplary embodiments, the variable gain amplifier is a digital amplifier. According to exemplary embodiments herein, the variable gain amplifier comprises plural fixed gain amplifiers.

According to exemplary embodiments, the distance measuring instrument comprises a second signal analyzer having a first signal input connected to an output of the variable gain amplifier. Thus, the second signal analyzer receives the amplified detected signal for further analysis. In particular, the amplified signals may have a substantially normalized intensity such that the analysis performed by the second signal analyzer may be substantially independent of the intensity of the received signal.

According to exemplary embodiments, the second signal analyzer is configured to determine occurrence times of a predetermined signal feature of signals supplied to its input. For example, the signal feature may be defined as an occurrence where the signal level exceeds a predetermined level. According to an exemplary embodiment, the predetermined level is a fixed level. According to another exemplary embodiment, the predetermined level is a variable level which depends on some other input. For example, the variable level may depend on an output of the first signal analyzer which is indicative of the intensity of the detected signal.

According to an exemplary embodiment, the second signal analyzer comprises a second signal input connected to the output of the first signal analyzer.

According to a further embodiment, the second signal analyzer is configured to determine the occurrence times of the signal feature relative to emission times of pulses of measuring light directed to the object.

According to an exemplary embodiment herein, a portion of the measuring light emitted from the light source is directly incident on the light detector, without being directed to and received back from the object. This portion of measuring light generates a first detected pulse signal which is amplified according to its intensity and analyzed by the second signal analyzer to identify a first occurrence time. Subsequently, the pulse of measuring light received back from the object generates a second detected signal which is amplified according to its intensity and similarly analyzed by the second signal analyzer to determine a second occurrence time. It is then possible to determine a value based on a difference between the first and second occurrence times, wherein this value represents a distance of the object from the measuring instrument.

According to exemplary embodiments of the invention, the at least one light source may include a high power pulsed diode laser and a pulsed microchip laser.

According to a further embodiment of the invention, the at least one light source of the distance measuring instrument comprises a signal laser and a light amplifier including at least one fiber doped with a rare earth element such as erbium and ytterbium. The inventors have found that the doped fiber laser has advantages over Q-switched microchip lasers used as light sources in conventional distance measuring instruments. For example, the Q-switched microchip laser does not allow a precise definition of emission times of light pulses, whereas the doped fiber laser allows for an accurate timing of emitted light pulses. For example, it is possible to achieve a definition of emission times of light pulses from the measuring instrument of about 20 ps or 10 ps, for example, when a doped fiber laser is used.

According to further embodiments of the present invention, a distance measuring method is provided which comprises: emitting a pulse of measuring light towards an object; receiving a pulse measuring light from the object and generating a pulse signal corresponding to the pulse of measuring light received from the object; delaying a first portion of the generated pulse signal for a predetermined time; generating an intensity signal indicative of an intensity of the generated pulse signal, while delaying the first portion of the generated pulse signal; amplifying the delayed first portion of the generated pulse signal using a gain dependent on the generated intensity signal; and determining a value representing a distance based on the amplified delayed first portion of the generated pulse signal.

In an embodiment, generating the intensity signal includes determining a maximum value of a second portion of the generated pulse signal.

In another embodiment, amplifying the delayed first portion of the generated pulse signal comprises dividing a signal corresponding to the delayed first portion by the intensity signal.

In another embodiment, determining the value representing the distance comprises identifying an occurrence time of a signal feature of the amplified first portion of the generated pulse signal.

In another embodiment, identifying the occurrence time of the signal feature of the amplified first portion of the generated pulse signal is performed relative to a time which depends on an emission time of the pulse of measuring light emitted towards the object.

In another embodiment, the method also includes generating a light pulse where a first portion of the generated light pulse forms the pulse of measuring light emitted towards the object, and receiving a second portion of the generated light pulse without directing it to the object and generating a pulse signal corresponding to the received second portion of light not directed to the object.

In yet another embodiment, a first pulse signal is generated which corresponds to the received second portion of light not directed to the object, a second pulse signal is generated which corresponds to the pulse of measuring light received from the object, and the value representing the distance is determined based on a temporal distance between the first and second pulse signals.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF THE INVENTION

Figure 1:
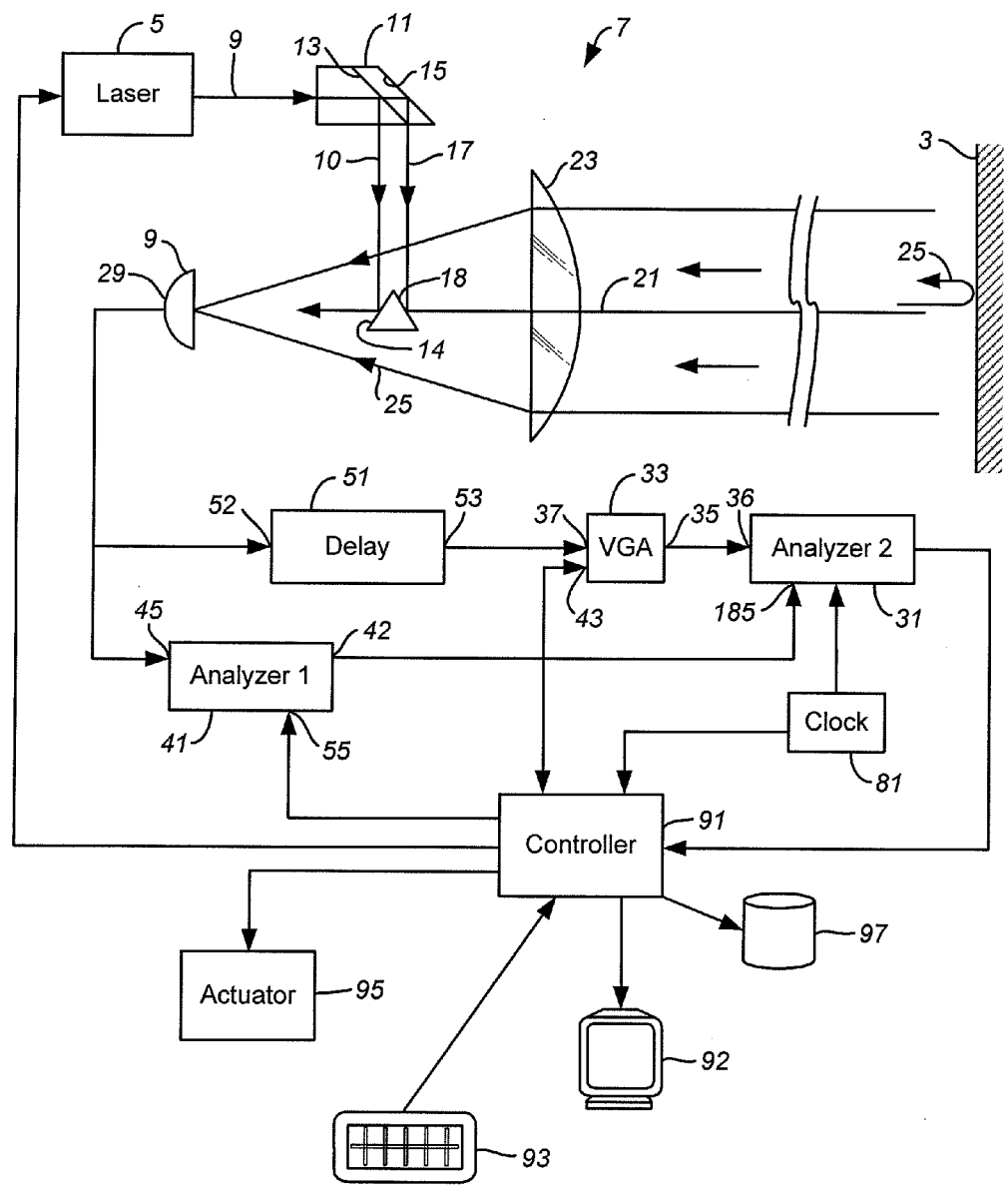
FIG. 1 is a schematic illustration of functional components of an embodiment of a distance measuring instrument according to the present invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a block diagram schematically illustrating an embodiment of a distance measuring instrument according to the present invention.

The distance measuring instrument 1 generates and emits measuring light towards a remote object 3 where a portion of the incident measuring light is diffused such that it can be received by the instrument 1. The measuring light received from the object is analyzed to determine a distance of the object 3 from the instrument 1. For this purpose, the instrument 1 comprises a light source 5 which generates the measuring light, optics 7 to direct the measuring light emitted from the light source 5 towards the object 3 and to receive measuring light back from the object. The instrument 1 further comprises a light detector 9 for detecting the measuring light received back from the object 3 and to generate electrical signals corresponding to intensities of the light received back from the detector.

The term measuring light as used in the present application should generally encompass electromagnetic radiation of any wavelength or wavelength range suitable for distance measurement, such as microwave radiation, visible light and invisible light. In the illustrated embodiment, the light source 5 is a laser, such as a microchip laser, a doped fiber laser or other suitable laser. Light 9 emitted from the laser enters a prism 11 which includes a partially reflective surface 13 and a mirror surface 14. A small monitoring portion 10 of the emitted light 9 is reflected from partially reflective surface 13 to be incident on a mirror surface 14 which directs that portion 10 onto the detector 9.

The instrument 1 further comprises an analyzer and control system 21 for analyzing the detected measuring light, determining measuring results and controlling the whole instrument.

The monitoring portion 10 of the emitted light 9 is directed to the detector to allow the analyzing and control system 21 to monitor the emitted measuring light. For example, the analyzing and control system 21 may determine occurrence times of particular features of that portion 10 which are relevant for the distance measurement. For example, a start time of a distance measurement can be determined based on the detection and analysis of the monitoring portion 10 of the light 9 emitted from the light source 5. A larger portion 17 of the light 9 emitted from the source 5 traverses the partially reflective surface 13 and is reflected from a mirror surface 15, and further reflected from a mirror 18 such that the measuring light reflected from mirror 18 is directed along an optical axis 21 of a lens 23. The lens 23 is schematically represented in FIG. 1 as a single lens element. In practice, however, the lens 23 may include plural lens elements to form an objective lens suitable to direct the measuring light along the optical axis 21 towards the object 3. For this purpose, the lens 23 may have functions for focusing the measuring light onto objects 3 at variable distances. A cross section of lens 23 is larger then necessary to emit the measuring light towards the object, wherein the exceeding portion of the cross section is used for receiving measuring light 25 reflected back from the object 23 and for directing this measuring light 25 onto the detector 9.

In the exemplary embodiment shown with reference to FIG. 1, a portion of the light pulse directed to the object is branched off by reflective surfaces 13 and 14 to be incident on detector 9 which is the same detector which also receives the light pulse reflected back from the object. Thus, both the start time and the stop time of the distance measurement are derived from light pulses incident on the same detector 9. In other embodiments, the start time of the distance measurement is determined by other principles. For example, the instrument may comprise an additional light detector, such as a PIN diode to receive a portion of the light pulse emitted towards the object. The start time of the distance measurement can then be generated based on output signals of such additional detector.

Further, it is possible to determine the start time of the distance measurement directly from an occurrence time of a trigger signal for emitting light pulses from the light source. To take into account possible time delays and offsets in determination of the start time, it is possible to calibrate the instrument relative to an object disposed at a known distance from the instrument, for example.

The detector 9 generally includes a sensor portion receiving the incident light and a circuit portion to generate electrical signals corresponding to intensities of the incident light. The detector 9 may include an amplifier for adjusting a signal level and impedance of the generated electrical signal such that it is suitable for subsequent analysis by the analyzer and control system 21.

The analyzing and control system 21 comprises an analyzer 31 for analyzing shapes or characteristics of the electrical signals provided at the output 29 of detector 9. However, intensities of the signals outputted from the detector 9 may vary by plural orders of magnitude depending on a distance of the object 3 from the instrument 1 and on an albedo of the object 3. The signals provided by the detector 9 have a very high dynamic range, accordingly, whereas the analyzer 31 has a limited dynamic range determined by a configuration of the analyzer 31. Therefore, the analyzer and control system 21 comprises a variable gain amplifier 33 configured to amplify signals provided by the detector 9 with a suitable gain such that the amplified signal has intensities within a reduced dynamic range suitable for analysis by analyzer 31. An output 35 of the variable gain amplifier 33 is connected to a first signal input 36 of analyzer 31.

The term variable gain amplifier as used in the present invention should not be limited to amplifiers having always gains larger than 1 such that a signal level outputted from the output 35 of the variable gain amplifier is always greater than a signal level of a signal supplied to a signal input 37 of the variable gain amplifier 33. The gain of the variable gain amplifier may be set to values less than 1, accordingly.

The analyzer and control system 21 comprises a signal analyzer 41 for determining the gain used by the variable gain amplifier 33 wherein a signal representing the gain is outputted from an output 42 of the signal analyzer 41 and supplied to a gain setting input 43 of the variable gain amplifier 33. A signal input 45 of the signal analyzer 41 is connected to the output 29 of the detector 9 such that the signal analyzer 41 receives a portion of the detection signal generated by the light detector 9. The signal analyzer 41 is configured to determine the gain based on a characteristic of the output signal, such as an intensity of the output signal of the light detector 9. For this purpose, the signal analyzer 41 has to process the inputted signal. Such processing will take a certain amount of processing time depending on the configuration of the signal analyzer 41. The signal representing the gain to be applied by the variable gain amplifier 33 will be available at the output 42 of signal analyzer 41 at a time which is later than an arrival time of the signal at the signal input 45 of signal analyzer 41. Further, when the signal representing the gain is available at the output 42 of signal analyzer 41 and supplied to the gain setting input 43 of the variable gain amplifier 33, the variable gain amplifier 33 will need a certain amount of time depending on the configuration of the variable gain amplifier until the gain of the amplifier is precisely adjusted according to the inputted gain value. This amount of time is referred to as the settling time of the variable gain amplifier 33. It follows that the variable gain amplifier 33 is ready for amplification of a given detection signal at a point in time which is later than a time at which the signal to be amplified with the variable gain is available at the output 29 of the detector 9.

Therefore, in the illustrated example, the signal input of the variable gain amplifier 33 is not directly connected to the output 29 of the light detector 9, and a signal delay module 51 is arranged in a signal path between the light detector 9 and the variable gain amplifier 33. In more detail, the delay module 51 has a signal input 52 which is connected to the output 29 of the light detector 9, and a signal output 53 of the delay module 51 is connected to the signal input 37 of the variable gain amplifier 33. The delay module is configured to receive a given signal at its input 52 and to make a substantially same or similar signal available at its output 53 wherein the outputted signal is delayed relative to the inputted signal by a predetermined delay time. The delay module 51 may comprise, for example, a delay line, a surface acoustic wave device or other device suitable for delaying an inputted signal by a predetermined amount of time. In the illustrated example, the delay time of the delay module is selected such that it is greater than a sum of the processing time of the signal analyzer 41 and the settling time of the variable gain amplifier 33. By such arrangement it is possible to complete the setting of the gain of the variable gain amplifier 33 until the signal to be amplified with the set gain arrives at the signal input 37 of the variable gain amplifier 33. For example, if the signal analyzer 41 is configured such that it has a processing time of 3 ns and if the variable gain amplifier 33 is configured such that it has a settling time of 2 ns, the delay module is designed such that it has a delay time of 5 ns or 6 ns or more.

As mentioned above, the signal analyzer 41 is configured to determine an intensity of a signal supplied to its input 45. In the illustrated embodiment, the signal analyzer 41 is configured such that it detects a peak amplitude of the signal supplied to its input 45 as the signal intensity. Further, the signal analyzer 41 has a reset input 55 to which a predefined signal can be applied for resetting the signal analyzer such that it starts to analyze a next signal supplied to its signal input 45.

For example, if the signal to be analyzed is a pulse shape, the signal analyzer 41 can determine the intensity of the pulse or, in the given example, determine the peak value of the pulse, and provide a corresponding signal at its output 42. A level of that signal representing the gain to be used by the variable gain amplifier 33 will be maintained constant until the signal analyzer 41 is reset by supplying the reset signal to its reset input 55. Thereafter, the signal analyzer 41 is prepared to analyze the intensity of a next pulse signal supplied to its signal input 45.

Figure 2:
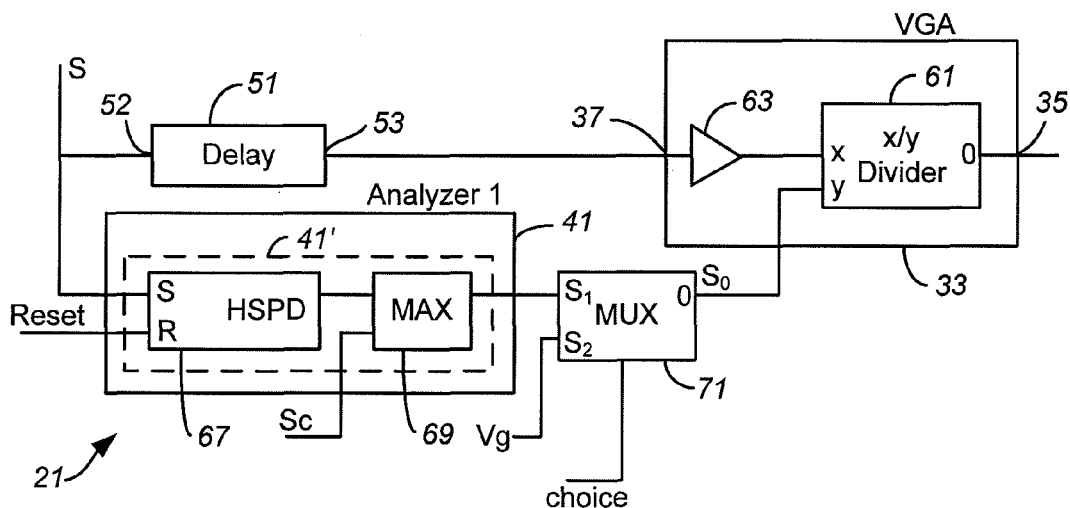
FIG. 2 and FIG. 3 are schematic illustrations of details of the distance measuring instrument shown in FIG. 1.

A configuration of the signal analyzer 41 and the variable gain amplifier 33 is shown in more detail in FIG. 2.

FIG. 2 is a schematic illustration of components of a portion of the analyzer and control system 21. In the illustrated example, the variable gain amplifier comprises an x/y divider 61, wherein the x input of the x/y divider 61 is connected to the signal input 37 of the variable gain amplifier and wherein the y input of the x/y divider 61 is connected to the gain setting input 43 of the variable gain amplifier 33. As shown in FIG. 2, it is possible to provide a fixed gain amplifier 63 in the signal path between the output 53 of the delay module 51 and the x input of the x/y divider. A signal output of the x/y divider is connected to or provides the output 35 of the variable gain amplifier.

The signal analyzer 41 comprises a high speed peak detector and hold module 67 having a signal input S providing the signal input 45 of the signal analyzer 41, a reset input R providing the reset input 55 of the signal analyzer 41, and an output O which is connected to a first signal input $S_1$ of an analog MAX module 69 which outputs the maximum of the two signals supplied to its inputs $S_1$ and $S_2$. The input $S_2$ is used to supply a signal $S_f$ to the signal analyzer 41, wherein the signal $S_f$ represents a maximum gain to be applied to the variable gain amplifier 33.

An output O of the MAX module 69 is connected to a first signal input $S_1$ of a MUX analog module 71 which further includes a second signal input $S_2$, a signal output O and a choice input C. The MUX module is configured to output one of the two signals supplied to its inputs $S_1$ and $S_2$ depending on a choice signal supplied to its choice input C.

In a first mode, where a choice signal selects input $S_2$ as the output of the MUX module 71, a fixed gain corresponding to a level $V_g$ can be supplied to input $S_2$ of the MUX module 71 to set the gain of the variable gain amplifier 33 to a value represented by level $V_g$. The gain of the x/y divider 61 is then set to $1/V_g$, which is independent on the intensity of the signal S supplied to the input 45 of the signal analyzer 41. This mode effectively disables the signal analyzer 41 and can be used when the adaptive amplification of the inputted signals S depending on their intensities is not desired.

In a second mode, where the choice signal is selected such that input $S_1$ of MUX module 71 is selected for output, the intensity analyzing operation of the signal analyzer 41 is enabled wherein the gain value provided at output 42 of signal analyzer 41 depends on the intensity of the signal S supplied to the input 45. However, a maximum gain can be set by supplying a signal level $S_f$ representing the maximum gain to the $S_2$ input of the MAX module 69.

Figure 3:
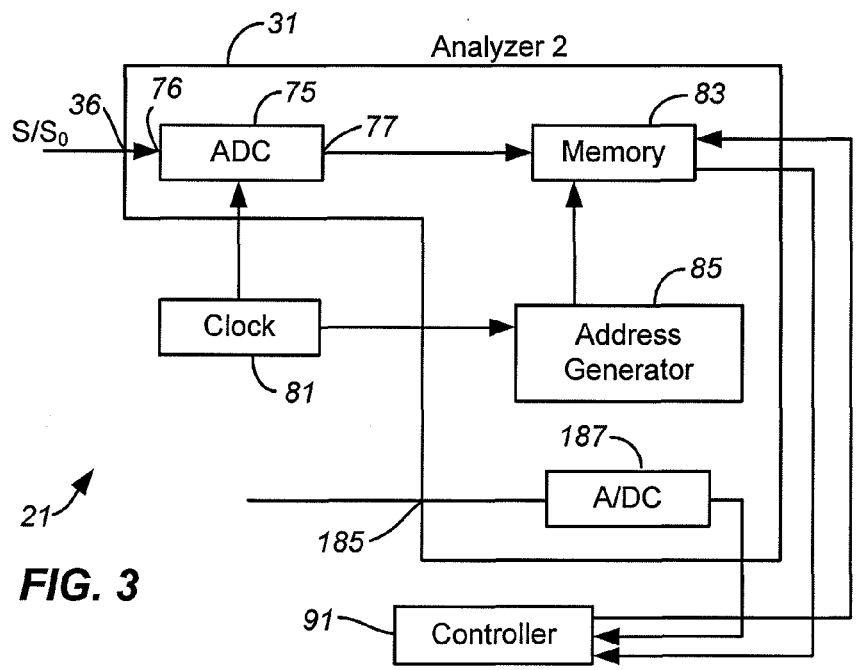

FIG. 3 is a more detailed illustration of further components of the analyzer and control module 21. As shown in FIG. 3, the signal analyzer 31 comprises a fast analog digital converter 75 having an analog input 76 which receives the amplified signal $S/S_0$ from the output 35 of the variable gain amplifier 33, where $S_0$ is the output 42 of the analyzer 41, for example the maximum amplitude of the signal S. The analog digital converter 75 is driven by a clock 81 such that the signal level supplied to the input 76 is sampled according to a rate determined by the clock 81, and digital values representing the signal level supplied to the input 76 are made available at an output 77 of the analog digital converter according to the rate determined by the clock 81. These digital values are then written into a memory 83 at addresses selected by an address generator 85. Also the address generator 85 is driven by the clock 81 such that the address selected by the address generator 85 is advanced according to the rate determined by the clock 81. Thus, subsequent digital readings of the analog input signal are stored in subsequent memory locations. The memory 83 is accessible from a controller 91 which can be any suitable computing device or network of devices such as personal computers or other hardware.

The controller 91 can be connected to user interface devices, such as a display 92 and a keyboard 93, or other suitable user interfaces such as touch screens, for example.

The controller 91 accessing the memory 83 can perform an analysis of the recorded digital values. For example, the controller may determine features of the digitized signal, such as occurrences of signal values exceeding a threshold or a center of gravity of a digitized pulse signal.

The controller 91 may also calculate a time when the determined signal feature occurred. Further, if there are two subsequent digitized pulses stored in the memory, the controller can determine the centers of gravity of both signals in terms of memory addresses and then calculate a temporal distance between the occurrence of two pulses based on a rate of the clock 81 advancing the address generator 85. Assume that a first one of such two digitized pulses stored in memory corresponds to the monitoring portion 10 of a light pulse 9 emitted by the light source 5 and incident directly onto the light detector 9 whereas the second of such digitized light pulses stored in memory corresponds to the portion 17 of the emitted light pulse directed to and received back from the object 3, then the temporal distance between the two analyzed signals represents the distance of the object 3 from the measuring instrument 1, wherein the distance of the object can be calculated as the temporal distance times the speed of light divided by two.

The distance measuring instrument as shown in FIG. 1 further comprises an actuator 95 driven by the controller 91 for changing an orientation of the optical axis 21 of optics 7. For example, the optics 7, light source 5 and detector 9 can be arranged as a module which is rotatable relative to a stand placed on the ground about a horizontal axis and a vertical axis. The controller 91 can then drive the actuator 95 such that the object 3 is scanned with measuring light wherein the distance of subsequent scan points of the object 3 from the measuring instrument 1 is determined as illustrated above. The resulting data, also refer to as a point cloud, can be stored by the controller 91 for further analysis in a memory, such as a hard disc 97 shown in FIG. 1.

Further exemplary embodiments of the present invention will be described below.

Figure 4:
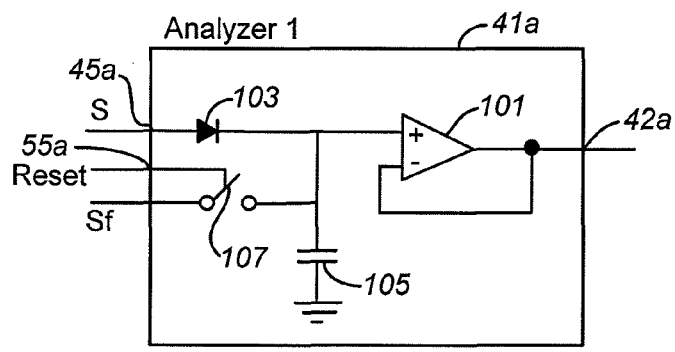
FIG. 4 illustrates a further embodiment of a first signal analyzer shown in FIG. 1.

FIG. 4 is a schematic illustration of a portion of an analyzer and control system 21a of a distance measuring instrument 1a which can be of a similar structure as that illustrated with reference to FIG. 1 above. A signal analyzer 41a shown in FIG. 4 provides the combined functions of a high speed peak detector and hold module and MAX module as represented by a functional box 41' shown in broken lines in FIG. 2. The signal analyzer 41a comprises a gain 1 buffer, for example an operational amplifier 101 having a non-inverted input which is supplied with the input signal S via an ideal diode 103, and an inverted input which is supplied with a feedback from its output. A hold capacitor 105 is connected to the non-inverting input of the operational amplifier 101 and is charged with a voltage $S_f$ representing the maximum gain upon operation of a reset switch 107.

Figure 5:
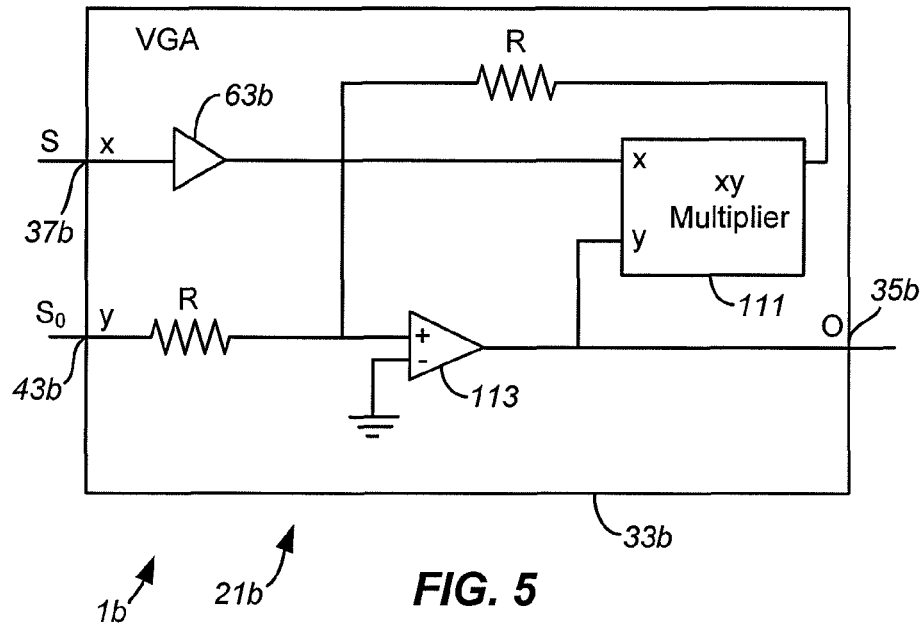
FIG. 5, FIG. 6, and FIG. 7 are illustrations of further embodiments of a variable gain amplifier shown in FIG. 1.

FIG. 5 shows an exemplary embodiment of a variable gain amplifier 33b of an analyzer and control system 21b of a distance measuring instrument 1b which can be similar in structure to that shown in FIG. 1. The variable gain amplifier 33b comprises an xy multiplier 111 having a X input which is supplied with the signal S to be amplified via a constant gain amplifier 63b, wherein it is also possible to omit the amplifier 63b and directly supply the signal S to be amplified to the X input of the xy multiplier. An operational amplifier 113 receives the signal $S_O$ representing the reciprocal gain at its inverting input via a resistor, and a non-inverting input of operational amplifier 113 is connected to ground. An output of the operational amplifier 113 provides the output O of the variable gain amplifier 33b at an output 35b, wherein the output of the operational amplifier 131 is also connected to the Y input of the xy multiplier 111. An output of the xy multiplier is supplied as a feedback via a resistor R to the inverting input of operational amplifier 113.

Figure 6:
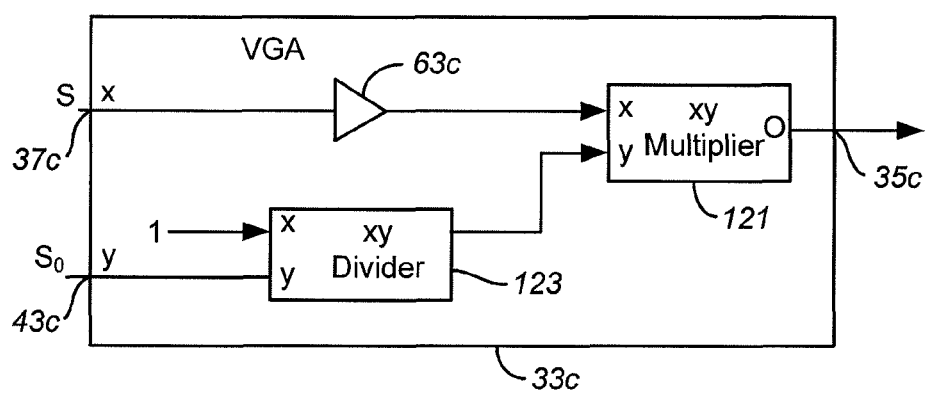

FIG. 6 is a schematic illustration of a further embodiment of a variable gain amplifier 33c which may have an improved bandwidth, in particular for low levels of input signal S, as compared to the embodiment shown in FIG. 5. The variable gain amplifier 33c comprises an xy multiplier 121 having an X input supplied with the signal S to be amplified via a fixed gain amplifier 63c, and an Y input connected to an output of a xy divider 123. The xy divider has an X input supplied with a constant signal (represented as "1" in FIG. 6), and an Y input supplied with the reciprocal gain $S_O$.

Figure 14:
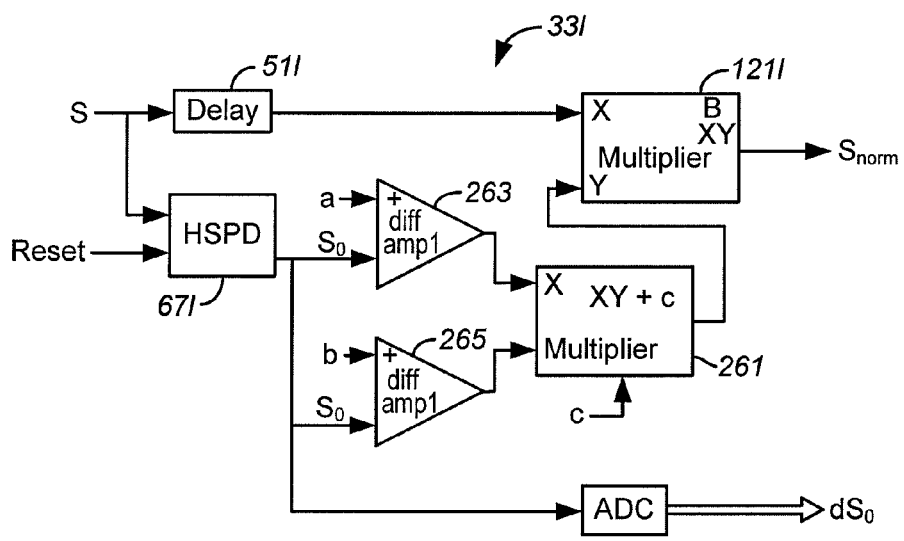
FIG. 14 is an illustration of details of a distance measuring instrument according to a further embodiment.

FIG. 14 is a schematic illustration of a further embodiment of a variable gain amplifier 331 which is a variation of the variable gain amplifier shown in FIG. 6. In the variable gain amplifier 331 shown in FIG. 14, an Y input of a multiplier 1211 is connected to an output of a multiplier 261 which receives its x and y inputs from outputs of differential amplifiers 263 and 265. Such arrangement allows to shape the divider function by constants a, b and c supplied to the differential amplifiers 263, 265 and the multiplier 261. It is further possible to provide further additional combinations of multipliers and differential amplifiers to increase the number of constants a, b, c, . . . for shaping the divider function.

Figure 7:
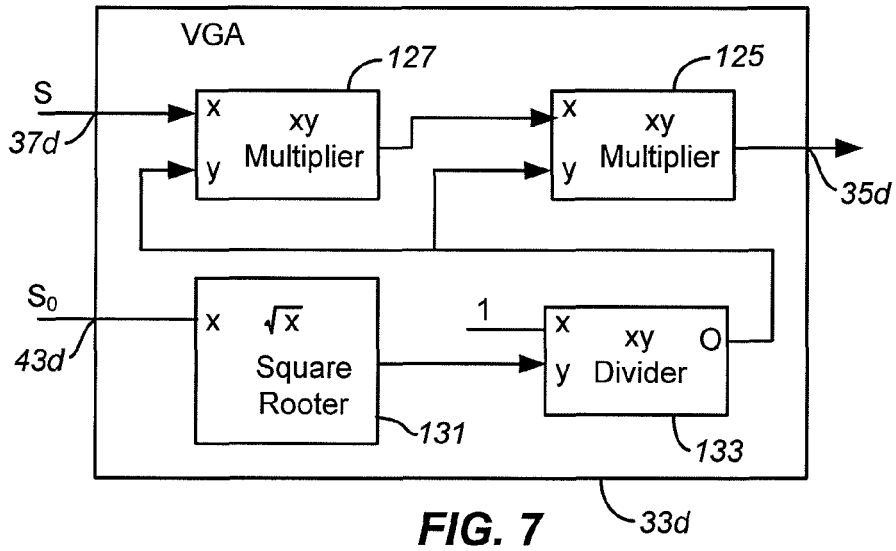

FIG. 7 shows a further embodiment of a variable gain amplifier 33d which could be used in the distance measuring instrument shown in FIG. 1. The variable gain amplifier 33d comprises an xy multiplier 127 having an X input supplied with the signal S to be amplified, and an output which is connected to an X input of a further xy multiplier 129. An output of the xy multiplier 129 provides the output of the variable gain amplifier 33d. The reciprocal gain $S_O$ is supplied to the input of a square rooter 131, and an output of the square rooter 131 is connected to an Y input of a xy divider 133. A constant signal (represented by "1" in FIG. 7) is supplied to an X input of xy divider 133. An output of the xy divider 133 is connected to Y inputs of both xy multipliers 127 and 129.

Figure 8:
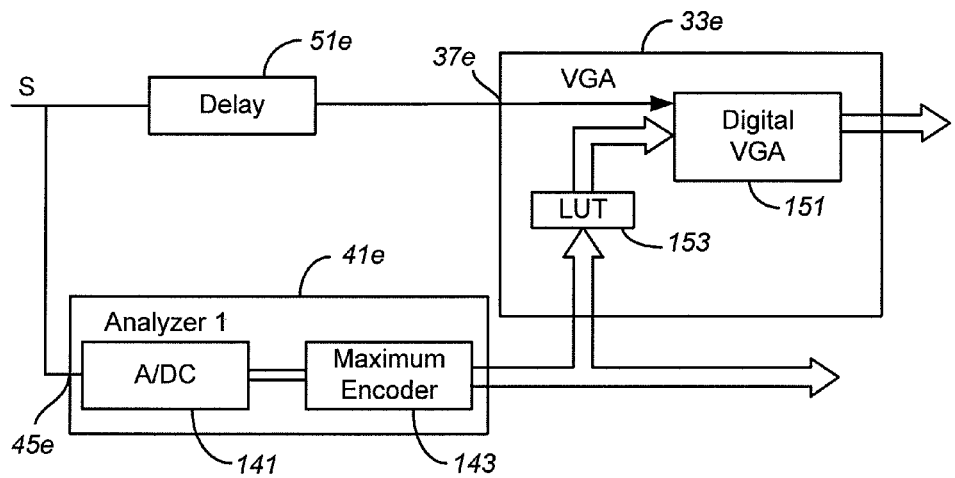
FIG. 8 is an illustration of details of a distance measuring instrument according to a further embodiment.

FIG. 8 illustrates a portion of a further embodiment of an analyzer and control system 21e which could be used in a distance measuring instrument according to an embodiment of the invention. In the embodiment shown in FIG. 8, a signal analyzer 41e and a variable gain amplifier 33e are implemented using digital electronics. The signal analyzer 41e comprises an analog digital converter 141 supplied with the signal S generated by a light detector. The signal is digitized by the analog digital converter 141 and supplied as a digital signal to a maximum encoder 143 which provides a maximum value of the received digital values at an output 42e of the signal analyzer 41e.

The variable gain amplifier 33e comprises a digital variable gain amplifier 151 having a signal input which is supplied with the signal to be amplified from a delay module 51e. The digital representation of the peak signal provided at the output 42e of the signal analyzer 41e can be directly supplied to a digital gain input of digital variable gain amplifier 151. In the embodiment shown in FIG. 8, a look-up table 153 is provided to receive the representation of the peak value and to translate this peak value to a gain which is supplied to the digital gain input of the digital variable gain amplifier 151. The look-up table is prepared in advance to take possible non-linear effects of the digital variable gain amplifier 151 into account or to achieve a desired further variation of the gain to be applied for amplification of the signal S based on the peak value detected by signal analyzer 41e.

Figure 9:
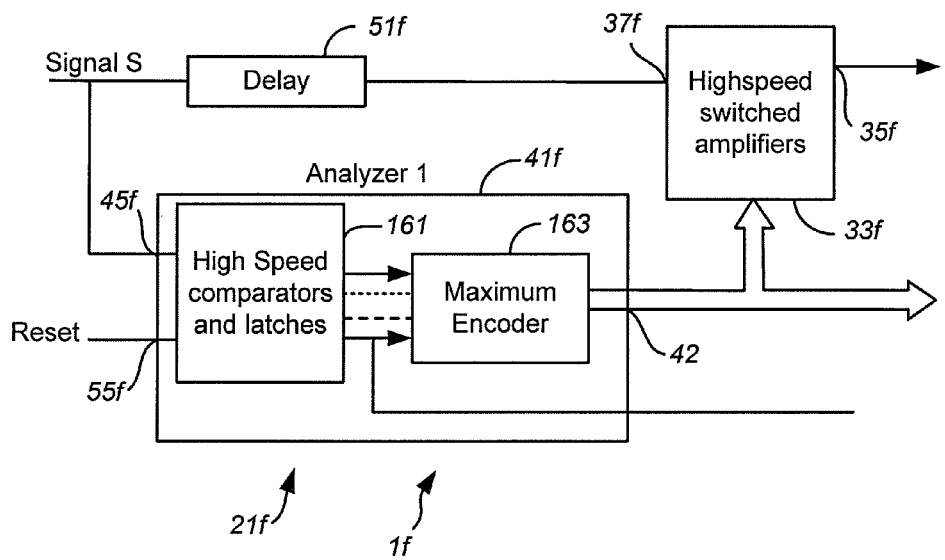
FIG. 9 is an illustration of details of a distance measuring instrument according to a further embodiment.

FIG. 9 is a schematic illustration of a portion of an analyzer and control system 21f according to a still further embodiment of the present invention. A signal analyzer 41f of system 21f comprises an array of plural high speed comparators and latches 161. For example, a number of the comparators and latches may be six. Each of the comparators and latches is supplied with the signal S to be analyzed, and the signal analyzer 41f further comprises an array of plural maximum encoders 163, wherein each maximum encoder is connected to a corresponding latch of the array of comparators and latches 161. The outputs of the plural maximum encoders 163 form a digital representation of the analyzed signal S. These outputs of the maximum encoder 163 also drive a corresponding number of high speed turn on/off switched amplifiers 33f such that an output 35f thereof provides the delayed and amplified signal S wherein the gain applied for amplification is dependent on a peak level of the signal S.

Reference is now made to FIG. 1, wherein the signal analyzer 31 is generally configured to determine occurrence times of signal features of the signal S generated by the light source 9.

Figure 10A:
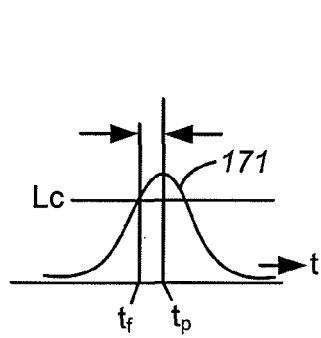
FIGS. 10a and 10b are schematic illustrations of detected pulses having different intensities.
Figure 10B:
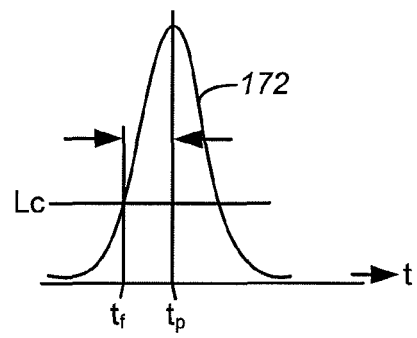

FIGS. 10a and 10b are schematic illustration of detected pulses having different intensities. FIG. 10a shows a pulse 171 of a relatively small peak value, whereas FIG. 10b shows a pulse 172 of a relatively higher peak value. An occurrence time of the signal peaks is indicated by tp. Since it is not easily possible to determine the occurrence times $t_p$ of the peak values, the signal analyzer 31 can be configured to determine occurrence times $t_f$ of features different from the occurrence times $t_p$ of the peak values. For example, the occurrence times $t_f$ can be defined as those times when the signal exceeds a predetermined constant threshold Lc. It is apparent that the times $t_f$ occur earlier than the peak times $t_p$ wherein a difference $t_p - t_f$ depends on the intensity of the signal. It is desirable to determine feature times $t_f$ which are indicative of the occurrence times of the peak values $t_p$ independently of the intensity of the signals.

Figure 11:
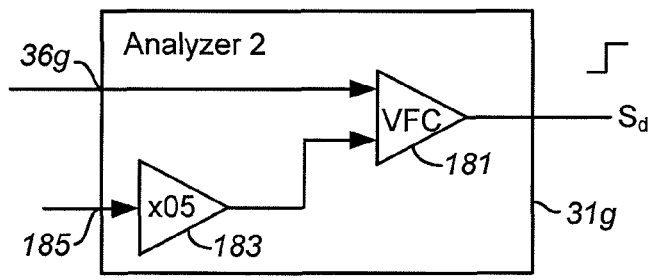
FIG. 11 is an illustration of a further embodiment of the second signal analyzer shown in FIG. 1.

FIG. 11 illustrates an embodiment of a signal analyzer 31g which could be used in the distance measuring instrument illustrated in FIG. 1. The signal analyzer 31g comprises a very fast comparator 181 having a first input receiving the signal to be analyzed from a delay module (not shown in FIG. 11), and having a second input connected to an output of a multiplier 183. Multiplier 183 has an input connected to a second signal input 185 of the signal analyzer 31g and which is connected to an output of signal analyzer 41 and representing the gain to be applied by the variable gain amplifier 33. The multiplier is configured to multiply the signal supplied to its input by a fixed factor, such as 0.5 in the illustrated example. An output $S_d$ of the comparator 181 may then provide a step-shaped signal which changes value when the signal supplied at input 36g exceeds the signal supplied at input 85 and multiplied by the fixed factor. The occurrence time of change of value of the signal $S_d$ can then be used as the feature time $t_f$ of the analyzed signal, and such feature time $t_f$ is a better representation of the occurrence time $t_p$ of the peak value of the signal at varying signal intensities as compared to using a constant threshold as illustrated in FIG. 10 above.

Reference is now made to FIG. 3: The signal analyzer shown in FIG. 3 further comprises an analog digital converter 187 to translate the analog value provided by signal analyzer 41 and which represents the gain applied to the variable gain amplifier into a digital value. This digital value is accessible by the controller 91 and can be taken into account when the occurrence times of the signals are determined by the controller 91.

Figure 12:
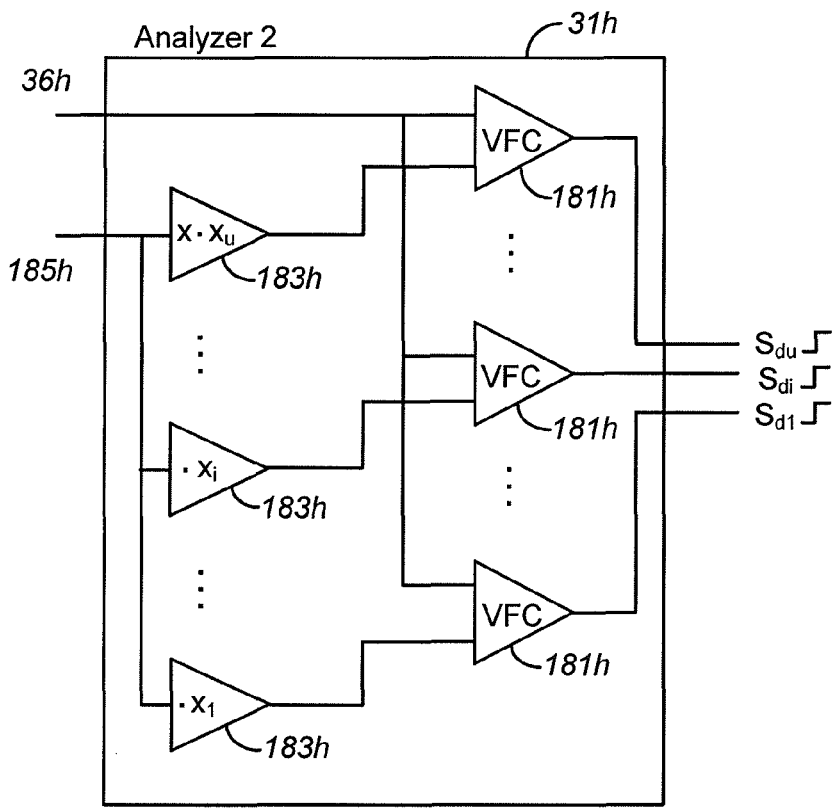
FIG. 12 is an illustration of a still further embodiment of the second signal analyzer shown in FIG. 1.

FIG. 12 illustrates a further embodiment of a signal analyzer 31h which has a configuration similar to that shown in FIG. 11 in that multipliers 183a are connected to inputs of vary fast comparators 181a. The other inputs of the vary fast comparators 181a are all supplied with the amplified signal to be analyzed. However, an array of multipliers 183a and comparators 181h is provided, wherein the multipliers 183a are configured to multiply their input signals with different fixed vectors $x_1, \ldots, x_i, \ldots, x_n$. Outputs $S_{d1}, \ldots, S_{di}, \ldots, S_{dn}$ represent occurrence times of different features of the analyzed signals, wherein the different occurrence times are those times where the signal exceeds different signal levels determined by the multiplication factors $x_i$ of the multipliers 183h. This allows to analyze the occurrence times at different levels of the signal, wherein the signal noise will be different at different signal levels. The possibility of analyzing the signal at different levels may then improve the total accuracy.

Figure 13:
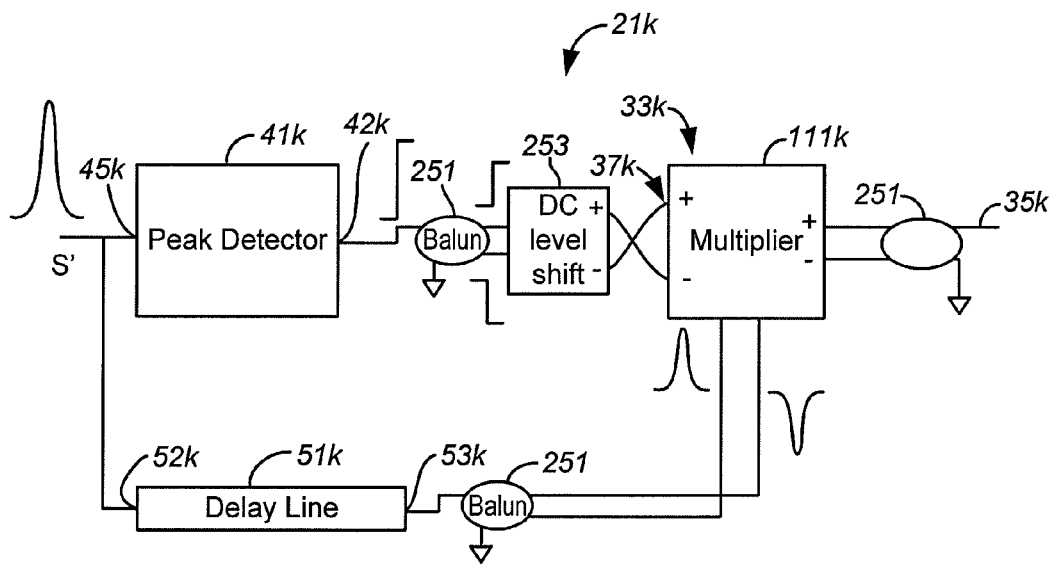
FIG. 13 is an illustration of details of a distance measuring instrument according to a further embodiment.

FIG. 13 illustrates a further embodiment of components of an analyzing and control system 21k which can be used in embodiments of the distance measuring instrument.

The analyzing and control system 21k comprises a signal analyzer 41k for determining the gain to be used for amplifying a signal S as supplied to both the signal analyzer 41k and a delay module 51k. The arrangement of components shown in FIG. 13 is similar to that shown in FIG. 2, wherein a variable gain amplifier 33k is embodied as a multiplier 111k. However, in the arrangement shown in FIG. 13, baluns 251 are connected to an output 42k of the signal analyzer 41k and an output 53k of the delay module 51k, respectively, for supplying the respective signals to the multiplier 111k via two symmetric lines. Further, a level shifter 253 is provided in the symmetric line between the output 42k of the signal analyzer 41k and an input of the multiplier 111k. A further balun 251 is connected to the symmetric line output of the multiplier 111k such that an output 35k of the amplified signal is again on an asymmetric line.

Figure 15:
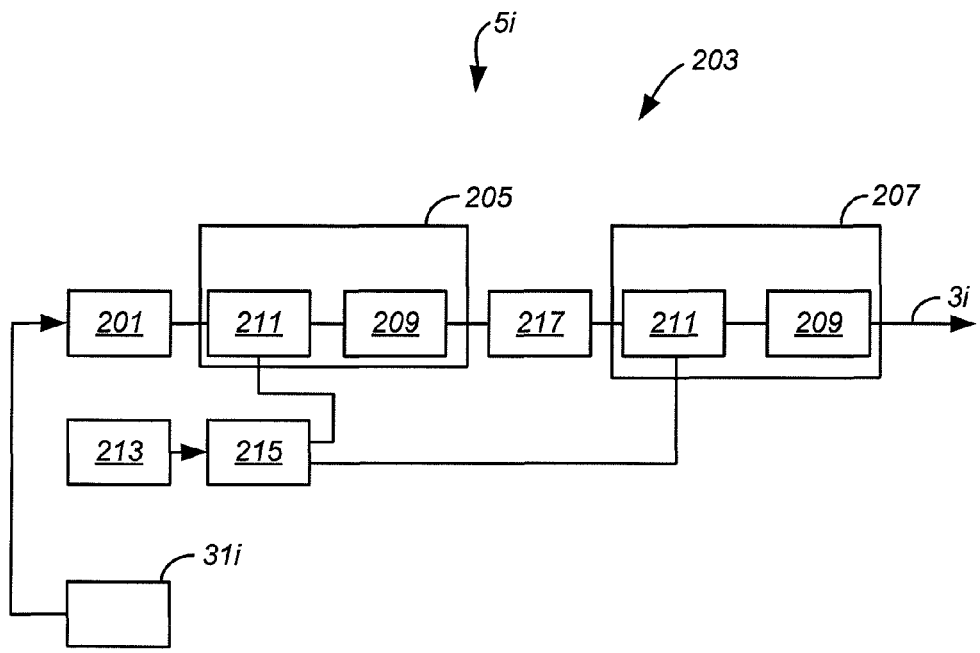
FIG. 15 and FIG. 16 are schematic illustrations of further embodiments of light sources which can be used in the distance measuring instrument shown in FIG. 1.

FIG. 15 shows a possible embodiment of a light source 5i which can be used in the distance measuring instrument shown in FIG. 1. The light source 5i comprises a signal laser 201 driven by a controller 91i to generate light pulses at a repetition rate determined by controller 91i and which may range, for example, from 1 kHz to 1000 kHz. The signal laser 201 may have an output power in a range from 1 to 20 mW, for example. It is, however, also possible to use light sources of a substantially higher output power having peak powers of about 5 W, for example. The signal laser may include a temperature stabilization or not.

The laser light generated by the signal laser is amplified by a two-stage amplifier 203 having a first stage 205 and a second stage 207, wherein each stage comprises a single mode rare earth doped fiber 209 and a wavelength division multiplexer 211. The rare earth element used for doping the fiber is erbium in the present example.

Both the light to be amplified and the pump light are supplied to the doped fibers 205 via the wavelength division multiplexers 211. The pump light is generated by a pump laser 213 and supplied to the wavelength division multiplexers 211 of stages 205 and 207 via a beam splitter 215. To avoid spontaneous emission of light and amplification thereof in the second stage 207, an optical filter 217 is provided between the two stages 205 and 207. The filter 217 may include an optical isolator, a wavelength filter and a time gating device, such as an acousto optic modulator, an electro optic modulator and a saturable absorber. In the present example, the filter 217 is a narrow-band wavelength filter and an optical isolator.

In the embodiment illustrated with reference to FIG. 15 above, the light is amplified in a single mode rare earth doped fiber, wherein the pump light is supplied into the fiber via a wavelength division multiplexer. It is also possible to use double clad fibers having a single mode rare earth doped core included in a clad to which the pump light is supplied. The pump light then enters the core on the clad.

While the embodiment of the light source illustrated with reference to FIG. 15 above includes a two stage amplifier, it is also possible to use light sources having more than two amplification stages.

Figure 16:
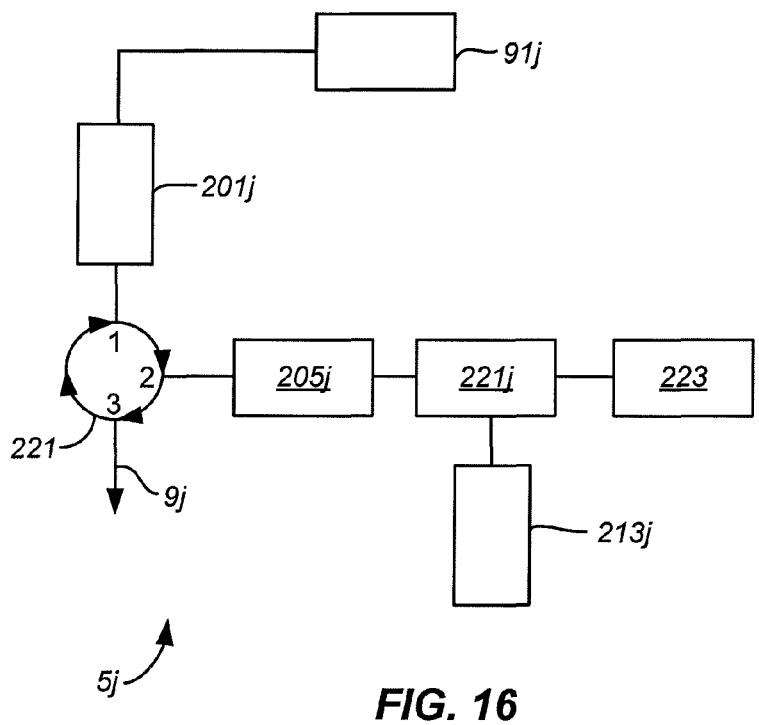

FIG. 16 schematically illustrates a further embodiment of a light source 5j which can be used in the instrument illustrated in FIG. 1. The light source 5j in FIG. 16 comprises a signal laser 201j generating output light which is supplied to a port 1 of a circulator 221. This light is outputted from a port 2 of the circulator 221 to be supplied to a rare earth doped fiber 209j. An amplified signal emitted from the fiber 209j traverses a wavelength division multiplexer 221j and is reflected from a combined filter and mirror 223 such that it again traverses the wavelength division multiplexer 221j to be further amplified in a doped fiber 209j. The further amplified light enters the circulator 221 at its port 2 and exits the circulator 221 at its port 3 to form measuring light 9j which can be emitted towards an object.

The doped fiber 209 is pumped with light from a pump laser 213j which is coupled into the fiber via the wavelength division multiplexer 221j.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A distance measuring method comprising:
emitting a pulse of measuring light towards an object;
receiving a pulse of measuring light from the object and generating a pulse signal corresponding to the pulse of measuring light received from the object;
delaying a first portion of the generated pulse signal for a predetermined time;
generating an intensity signal indicative of an intensity of the generated pulse signal, while delaying the first portion of the generated pulse signal;
amplifying the delayed first portion of the generated pulse signal using a gain dependent on the generated intensity signal; and
determining a value representing a distance based on the amplified delayed first portion of the generated pulse signal and the intensity signal indicative of the intensity of the generated pulse signal.

2. The distance measuring method according to claim 1 wherein the generating of the intensity signal includes determining a maximum value of a second portion of the generated pulse signal.

3. The distance measuring method according to claim 1 wherein the amplifying of the delayed first portion of the generated pulse signal comprises dividing a signal corresponding to the delayed first portion by the intensity signal.

4. The distance measuring method according to claim 1 wherein the determining of the value representing the distance comprises identifying an occurrence time of a signal feature of the amplified first portion of the generated pulse signal.

5. A distance measuring method comprising:
emitting a pulse of measuring light towards an object;
receiving a pulse of measuring light from the object and generating a pulse signal corresponding to the pulse of measuring light received from the object;
delaying a first portion of the generated pulse signal for a predetermined time;
generating an intensity signal indicative of an intensity of the generated pulse signal, while delaying the first portion of the generated pulse signal;
amplifying the delayed first portion of the generated pulse signal using a gain dependent on the generated intensity signal; and
determining a value representing a distance based on the amplified delayed first portion of the generated pulse signal and the intensity signal indicative of the intensity of the generated pulse signal, wherein determining of the value representing the distance comprises identifying an occurrence time of a signal feature of the amplified first portion of the generated pulse signal, and identifying occurrence time of the signal feature of the amplified first portion of the generated pulse signal is performed relative to a time which depends on an emission time of the pulse of measuring light emitted towards the object.

6. The distance measuring method according to claim 1 further comprising:
generating a light pulse, wherein a first portion of the generated light pulse forms the pulse of measuring light emitted towards the object; and
receiving a second portion of the generated light pulse without directing it to the object and generating a pulse signal corresponding to the received second portion of light not directed to the object.

7. A distance measuring method comprising:
generating a light pulse;
emitting a pulse of measuring light towards an object, wherein a first portion of the generated light pulse forms the pulse of measuring light emitted towards the object;
receiving a second portion of the generated light pulse without directing it to the object and generating a first pulse signal corresponding to the received second portion of light not directed to the object;
receiving a pulse of measuring light from the object and generating a second pulse signal corresponding to the pulse of measuring light received from the object; and
delaying a first portion of the generated pulse signal for a predetermined time;
generating an intensity signal indicative of an intensity of the generated pulse signal, while delaying the first portion of the generated pulse signal;

amplifying the delayed first portion of the generated pulse signal using a gain dependent on the generated intensity signal; and determining a value representing a distance based on the amplified delayed first portion of the generated pulse signal, the intensity signal indicative of the intensity of the generated pulse signal, and a temporal distance between the first and second pulse signals.

* * * * *